United States Patent [19]
Shin

[11] Patent Number: 5,662,482
[45] Date of Patent: Sep. 2, 1997

[54] PCMCIA CONNECTOR HAVING A PROTECTION COVER

[75] Inventor: Seung-Kee Shin, Suwon, Rep. of Korea

[73] Assignee: SamSung Electronics Co., Ltd., Suwon, Rep. of Korea

[21] Appl. No.: 558,546

[22] Filed: Nov. 16, 1995

[30] Foreign Application Priority Data

Nov. 17, 1994 [KR] Rep. of Korea ................ 30317/1994

[51] Int. Cl.$^6$ .................................................. H01R 13/60
[52] U.S. Cl. ........................ 439/64; 439/541.5; 361/684
[58] Field of Search ................... 439/64, 377, 540.1, 439/541.5; 361/684, 685, 686

[56] References Cited

U.S. PATENT DOCUMENTS

| | | | |
|---|---|---|---|
| 5,191,544 | 3/1993 | Benck et al. | 361/684 |
| 5,299,089 | 3/1994 | Lwee | 361/684 |
| 5,324,204 | 6/1994 | Lwee | 439/621 |
| 5,337,220 | 8/1994 | Granitz | 439/326 |
| 5,400,216 | 3/1995 | Tsai | 439/638 |
| 5,490,791 | 2/1996 | Yamada et al. | 361/684 |
| 5,495,586 | 2/1996 | Adachi et al. | 361/685 |

Primary Examiner—Neil Abrams
Assistant Examiner—T. C. Patel
Attorney, Agent, or Firm—Robert E. Bushnell, Esq.

[57] ABSTRACT

A personal computer memory card international association card connector assembly, comprising a connector panel having a place for receiving a personal computer memory card international association card of type 3, plural pins to be connected electrically to personal computer memory card international association cards of type 1 to type 3, a groove for fixing a screw, and a protection cover having a shorter internal width than the electrical connection base of a personal computer memory card international association card, to prevent a personal computer memory card international association card of type 1 or type 2 from being incorrectly inserted into the space above a connector supporting every kind of personal computer memory card international association cards of type 1 to 3. The protection cover further helps to prevent short circuits by preventing electrical components installed in a computer case in a position around the port containing the card connector assembly from coming into contact with a conductive surface of an inserted personal computer memory card international association card.

13 Claims, 5 Drawing Sheets

PCMCIA CONNECTOR HAVING A PROTECTION COVER

CROSS-REFERENCE TO RELATED APPLICATIONS

This application makes reference to, incorporates herein and claims all benefits accruing under 35 USC §119 by virtue of a patent application earlier filed in the Korean Industrial Property Office on 17 Nov. 1994, entitled PCMCIA CONNECTOR HAVING A PROTECTION COVER which was duly assigned Serial No. 94-30317 by that Office.

BACKGROUND OF THE INVENTION

1. Field of the Invention

The present invention relates to a mounting arrangement for electrically connecting detachable peripheral components to a computer, and more particularly to a personal computer memory card international association connector assembly having a protection cover for limiting placement of a personal computer memory card international association card during insertion into the electrical contacts of the connector.

2. Description of Background Art

The computer industry continually attempts to miniaturize the functional elements of portable computers to make carrying more convenient. One currently popular approach to reducing the size and weight of a portable computer is to provide a connection port within the computer case for detachably receiving peripheral components constructed from integrated circuits within a housing approximating the length and width of a credit card.

In accordance with the current trend, the Personal Computer Memory Card International Association (PCMCIA) has established new standards for extended memory cards, MODEM (modulator and demodulator) cards, LAN (local area network) interface cards and HDD (hard disk drive) cards. According to one aspect of the new standards, each kind of personal computer memory card international association card must be adapted for use with a standardized card interface controller for driving the card after it has been detachably connected to the portable computer or similar device through a personal computer memory card international association connector. When a user operates the computer after inserting a personal computer memory card international association card into the connector, the card interface controller automatically detects the kind of personal computer memory card international association card and operates the card according to its intended function.

Due to differences in the volume required by the electrical and mechanical components which occupy different types of cards, personal computer memory card international association cards are currently classified according to their overall exterior heights, designated in order of increasing thickness as either type 1, type 2 or type 3. In order to support each type of personal computer memory card international association card with a single universal personal computer memory card international association connector, a port forming an opening in the computer case to access the personal computer memory card international association connector must have a height that is at least as great as that of the thickest personal computer memory card international association card. I have discovered that a problem exists with conventional personal computer memory card international association connectors that are able to accommodate a type 3 card, because thinner personal computer memory card international association cards of type 1 or 2 may be easily incorrectly inserted into the opening in the computer case in a position vertically above the connector. Consequently, incorrectly inserted personal computer memory card international association cards fail to make proper electrical contact with the pin array of the card interface controller for operating the card, and the computer case may need to be disassembled in order to remove a wrongly inserted card of type 1 or 2. Efforts such as U.S. Pat. No. 5,299,089 for a *Connector Device Having Two Storage Decks and Three Contact Arrays For One Hard Disk Drive Package Or Two Memory Cards* to N. H. Lwee, U.S. Pat. No. 5,324,204 for a *Connector Device* to N. H. Lwee, and U.S. Pat. No. 5,400,216 for *IC Card Expansion Slot Assembly* to I. Tsai, provide dedicated tracks for a pair of type 1 cards, and while these designs may be able to alternatively accommodate a single type 2 card, they can not accommodate a type 3 card. In essence, these designs depend upon a housing having opposite side walls and upper and lower housing plates that rigidly define the orifice through which their connector devices may receive a memory card. Accordingly, the orifice is unalterably fixed in width and height. I have also observed that these designs consequently facilitate inadvertent upside down admission of a memory card serving as a substrate beating a hard disk drive package. In addition, I have found that the surface of personal computer memory card international association cards are often covered with a conducting material such as metal, capable of causing a short-circuit among electrical components within the computer case.

SUMMARY OF THE INVENTION

An object of the present invention is to provide an improved personal computer memory card international association connector assembly.

It is another object to provide a personal computer memory card international association connector assembly supporting all types of personal computer memory card international association cards, having a protection cover preventing a card from being incorrectly inserted.

It is still another object to enlarge the size of the grounded surface separating the personal computer memory card international association card from the electrical components in the computer case surrounding the connection port, in order to prevent short circuits.

It is yet another object to provide increased protection from electromagnetic interference or electromagnetic conduction around a personal computer memory card international association card.

It is still yet another object to provide a personal computer memory card international association connector assembly supporting at least three types of personal computer memory card international association cards, with a readily removable cover mountable upon the connector assembly restricting incorrect insertion of those cards while preventing upside down insertion of some of those cards.

These and other objects may be achieved with a personal computer memory card international association connector assembly constructed according to the principles of the present invention with a connector plate having a plurality of pins arrayed at one end for electrical connection to sockets in an electrical connection base of a personal computer memory card international association card of either type 1, type 2 or type 3, with the connector plate having a pair of longitudinal side rails extending perpendicularly outwardly from, but in the same place as the pin array, and spaced horizontally apart by a first width to form an opening for receiving an upper housing of the personal computer memory card international association card. Each side rail includes a longitudinal groove in substantially the same plane as the pin array, with a face of each groove forming a pair of opposing side walls spaced apart by a second width greater than said first width for receiving opposite lateral edges of the electrical connection base of the personal computer memory card international association card. A protection cover attached to the connecter plate has a pair of parallel side walls spaced apart by said first width extending a height of said opening formed by said side rails, said side walls being spaced apart by said first width and preventing the electrical connection base of the personal computer memory card international association card from being incorrectly inserted above the connecter plate.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
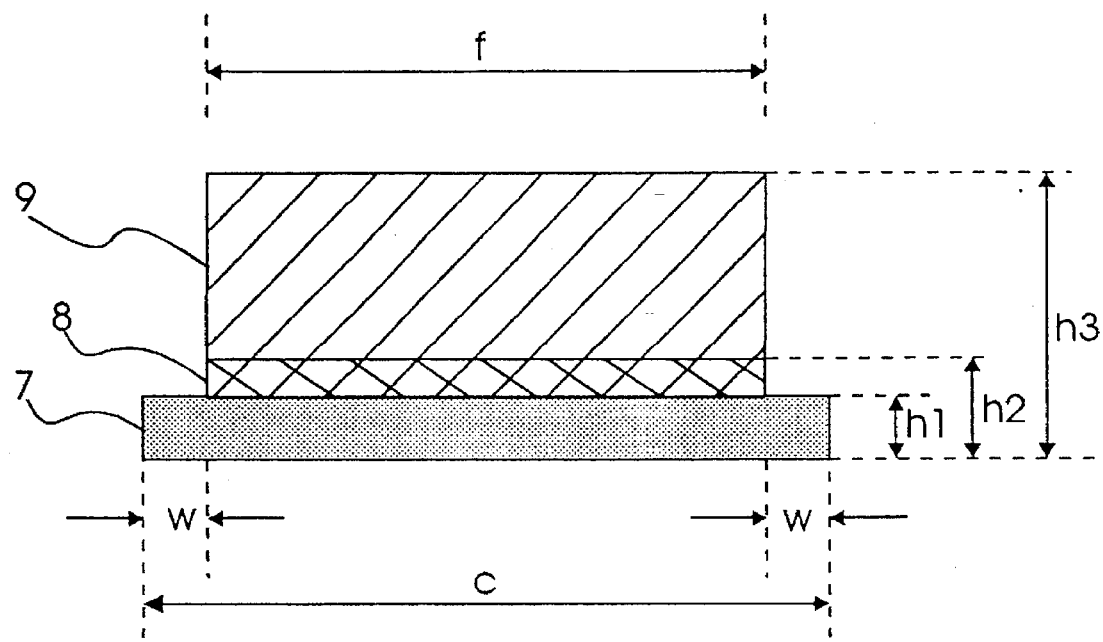
FIG. 1 shows the differences of height among three types of personal computer memory card international association cards.

Turning now to the drawings, FIGS. 1 through 4 illustrate personal computer memory card international association cards of type 1 to type 3 having predefined standard dimensions. In FIG. 1, the relationship between standard exterior heights h1, h2 and h3 are schematically illustrated for the three types of personal computer memory card international association cards currently specified by the personal Computer Memory Card International Association. Each type of card has an electrical connection base 7, having the same predefined width c and height h1, for accommodating, by way of example, a sixty-eight pin electrical socket and circuit board. A type 2 personal computer memory card international association card additionally includes a centrally located low profile upper housing 8, while a type 3 personal computer memory card international association card includes a high profile upper housing 9, extending the thickness of the cards to an overall exterior height h2 or h3, respectively. The width f of upper housing 8 or 9 is standardized to be less than the predefined width c of the electrical connection base 7, in order to expose opposite lateral edges of the base each having a width w.

Figure 2:
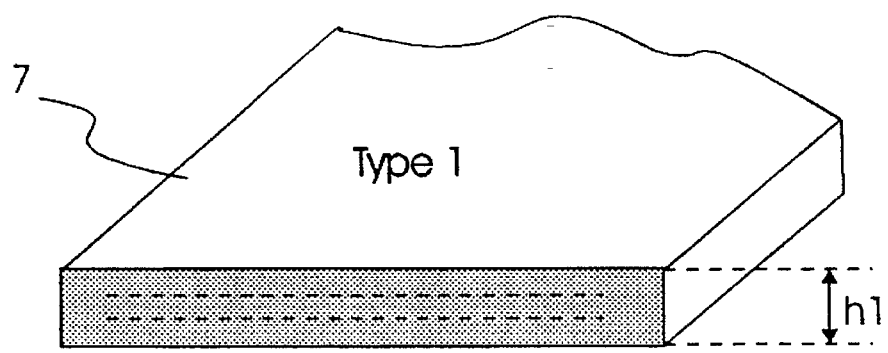
FIG. 2 illustrates an external perspective view of a personal computer memory card international association card of type 1.
Figure 3:
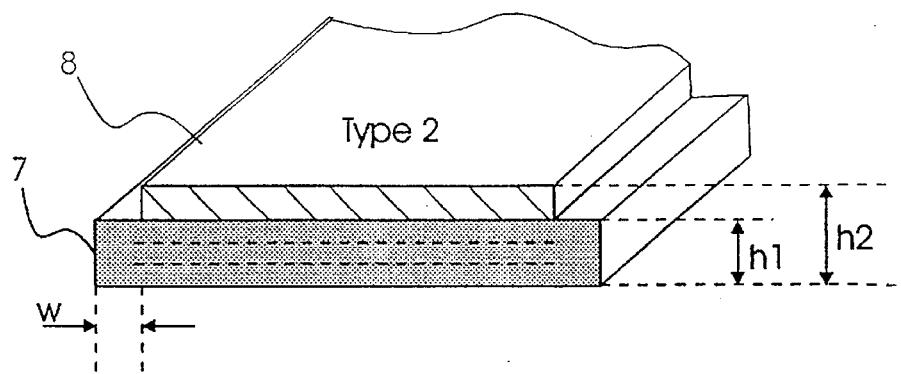
FIG. 3 illustrates an external perspective view of a personal computer memory card international association card of type 2.
Figure 4:
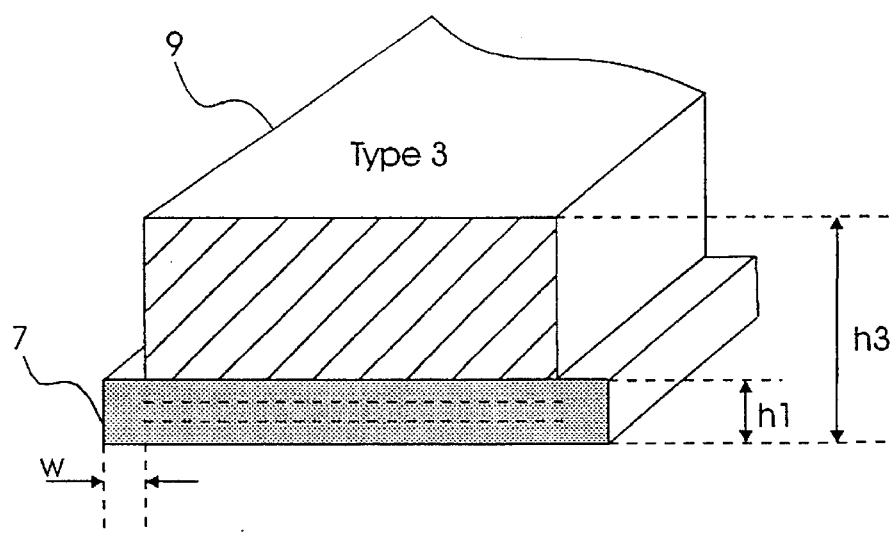
FIG. 4 illustrates an external perspective view of a personal computer memory card international association card of type 3.

FIG. 2 illustrates a personal computer memory card international association card of type 1, typically configured as an extended memory circuit able to be contained completely within an electrical connection base 7 having the standard height h1 of 3.3 millimeters. A personal computer memory card international association card of type 2 having a standard overall exterior height h2 of five millimeters is illustrated in FIG. 3, has of both an electrical connection base 7 and low profile upper housing 8 to accommodate relatively larger input/output, or interface circuits. FIG. 4 illustrates a personal computer memory card international association card of type 3 having a standard overall exterior height h3 of 10.5 mm, having an electrical connection base 7 and high profile upper housing 9 able to accommodate a hard disk drive. It should be understood that electrical connection base 7 and upper housings 8 and 9 are discussed herein as distinct elements merely to illustrate the dimensional differences between the three type of personal computer memory card international association cards, and that the thicker cards may alternatively be constructed as an integral, stepped housing conforming to the specified exterior dimensions.

Figure 6:
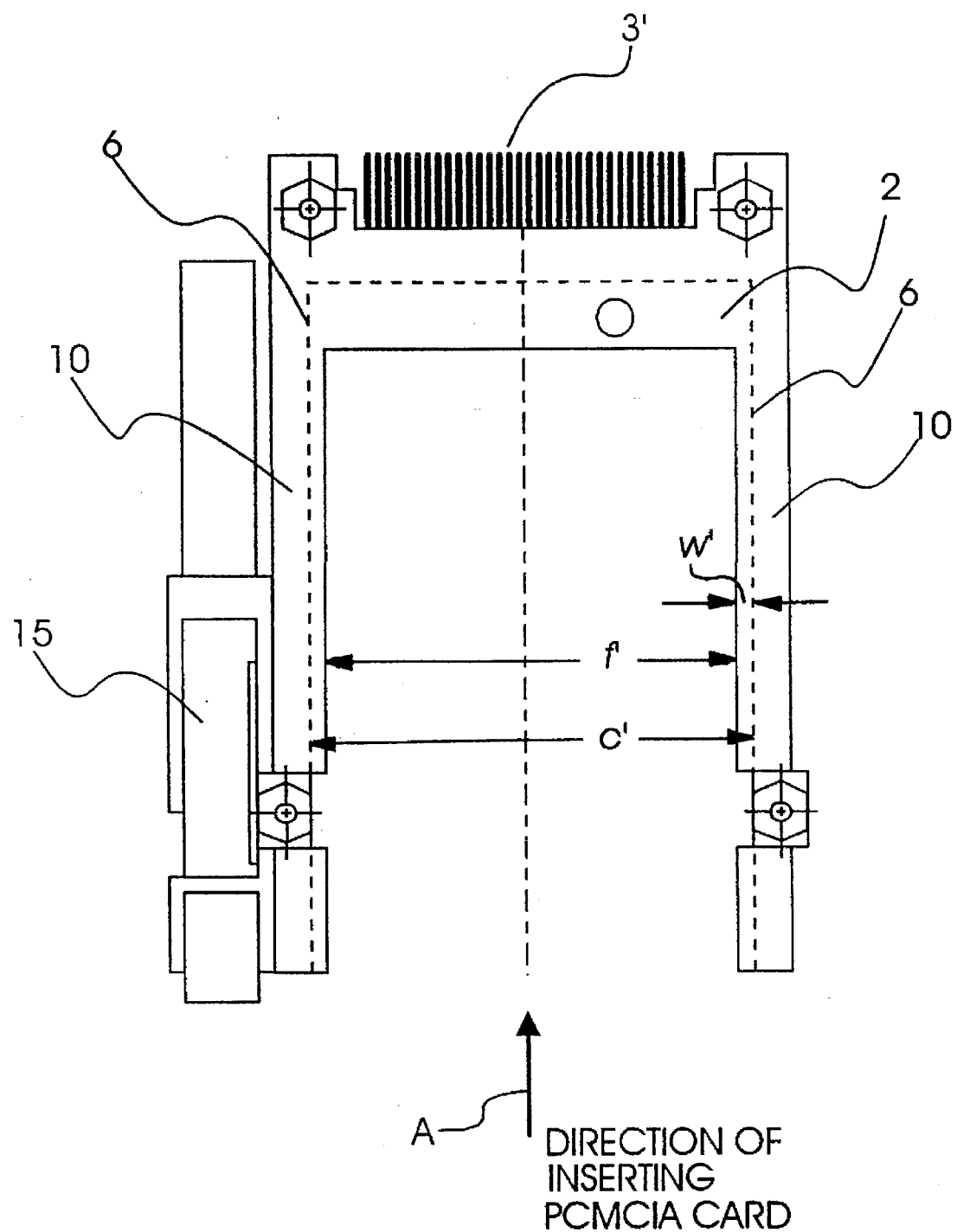
FIG. 6 illustrates a plan view of a conventional personal computer memory card international association connector for connecting a personal computer memory card international association card to the computer.

A conventional personal computer memory card international association connector, illustrated in FIG. 6, may be formed as a connector plate 2 incorporating a pin array 3' for electrical connection to a socket in the electrical connection base 7 of an inserted personal computer memory card international association card, via a corresponding pin array (not shown) mounted beneath plate 2. A button 15 may be connected to an ejection assembly (not shown) to assist in removing an inserted personal computer memory card international association card. The connector plate 2 includes a pair of longitudinal side rails 10 extending perpendicularly to the pin array 3', spaced apart by a first distance f' to form an open area therebetween. Conventionally, the volume above the connector plate 2 is left open to accommodate the upper housing 8 or 9 of a type 2 or type 3 personal computer memory card international association card within the open area formed by the side rails 10.

Shown in FIG. 6 by a hidden line, each longitudinal side rail 10 incorporates a groove 6, formed in an inner wall in substantially the same horizontal plane as the pin array 3' of the connector plate 2. Although not shown in FIG. 6, pin array 3' should be understood to extend through the end of the connector plate 2 to expose the ends of each pin within a continuation of the groove 6 formed in the closed end of connector plate 2, to make with a corresponding socket in the electrical connection base of a personal computer memory card international association card. The two grooves 6 formed in inner walls of the pair of longitudinal side rails 10 should each have a depth w', so that opposing faces of the two grooves 6 are spaced apart by at least a width c' for receiving opposite lateral edges of the electrical connection base 7. Arrow A, shown upwardly directed in FIG. 6, indicates the direction of insertion of a personal computer memory card international association card, whether of type 1, type 2 or type 3.

Figure 5:
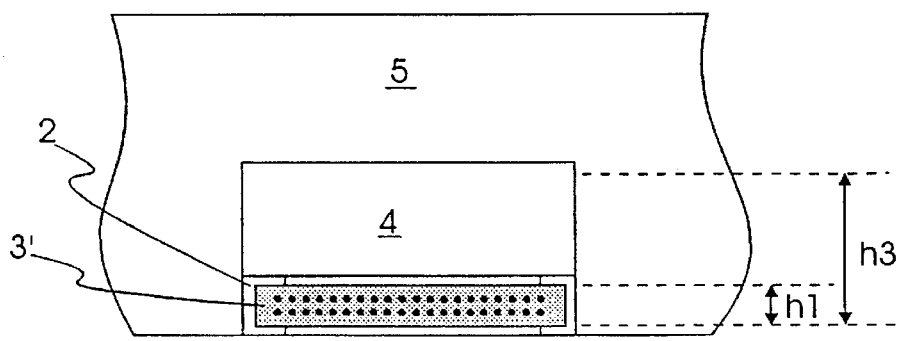
FIG. 5 illustrates a front view of the opening in a computer housing including a conventional connector for a personal computer memory card international association card.

As illustrated in FIG. 5, a personal computer memory card international association port 4 in the case 5 of a computer or similar device is formed having a height h3 at least as great as that of a type 3 card in order to permit insertion of all types of personal computer memory card international association card into the connector plate 2 for engaging pin array 3'. Consequently, much thinner type 1 or type 2 cards may be erroneously inserted into the port 4 in a position above the connector plate 2 and its pin array 3'.

Figure 7:
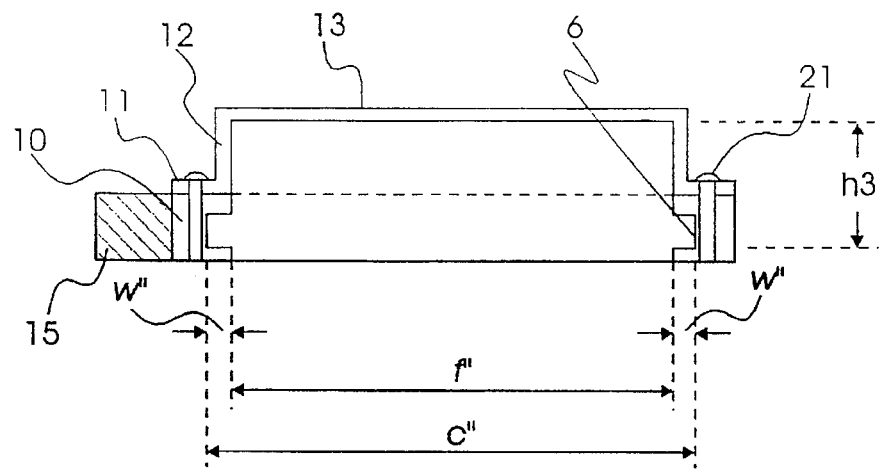
FIG. 7 illustrates a cross-sectional front view of a personal computer memory card international association connector assembly taken along sectional line VII–VII in FIG. 8, to show a protection cover constructed according to the principles of the present invention.
Figure 8:
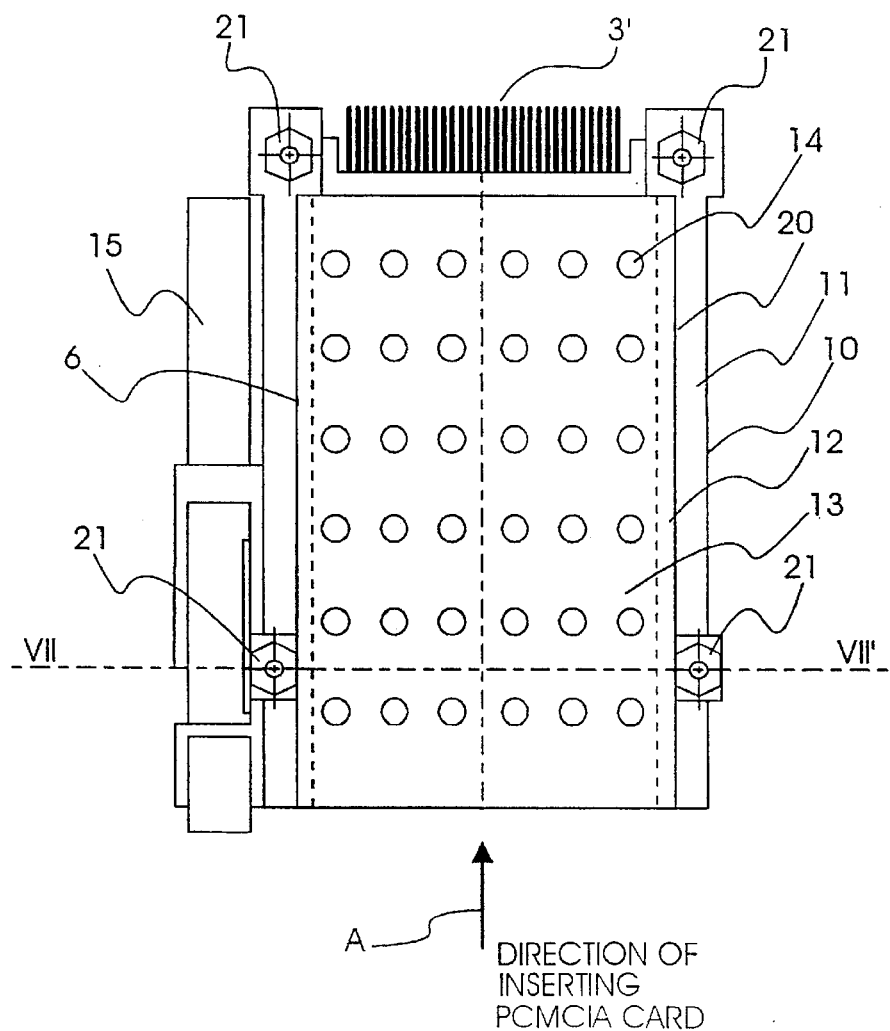
FIG. 8 illustrates a plan view of a personal computer memory card international association connector assembly having a protection cover constructed according to the principles of the present invention.

The present invention provides a protection cover for preventing personal computer memory card international association cards of type 1 and type 2 from being incorrectly inserted into a port capable of accommodating personal computer memory card international association cards of type 3. FIG. 8 illustrates a plan view of a protection cover according to the present invention, attached to the upper surface of a connector plate 2 like that shown in FIG. 6. The structure and operation of the present invention can best be described with respect to FIG. 7, illustrating a cross-sectional view taken along the line VII–VII' of FIG. 8.

The protection cover is formed by pair of parallel side walls 12 spaced apart by an internal width f' to extends the height of the constricted space formed between inner walls of the pair of longitudinal side rails 10 of connection plate 2. That is, in the preferred embodiment of the invention the protection cover is manufactured with an internal width f" narrower than the width c" of the electrical connection base 7 of a personal computer memory card international association card. Accordingly, the electrical connection base 7 will only fit within the wider spacing formed between opposing faces of the two grooves 6, thereby preventing incorrect insertion of the cards of type 1 or type 2 above the connector plate 2. It should be understood that although the same letters f and c are used in the specification to refer both to the width of a personal computer memory card international association card and a connector assembly in order to show correspondence, the connector assembly is constructed very slightly wider than the card to permit easy insertion.

The parallel side walls 12 of the protection cover may be easily and quickly attached to, or removed from, the upper surface of the connection plate 2 by a threaded fasteners such as four nuts and bolts or screws 21 through a horizontal lip extending from the bottom of each wall 12. Parallel side walls 12 are prevented from flexing by a cross member 13 extending between the top edges of walls 12, at vertical distance above bottom face of the two grooves 6 at least equal to the height h3' of a type 3 personal computer memory card international association card. This easy removability enables the cover to be quickly mounted upon an existing plate 2 (e.g., as a modification or a retrofit) while preserving an option that a cover previously installed can be readily removed and replaced with a cover also constructed in accordance with the principles of the present invention, albeit with some difference in shape or function.

Figure 9:
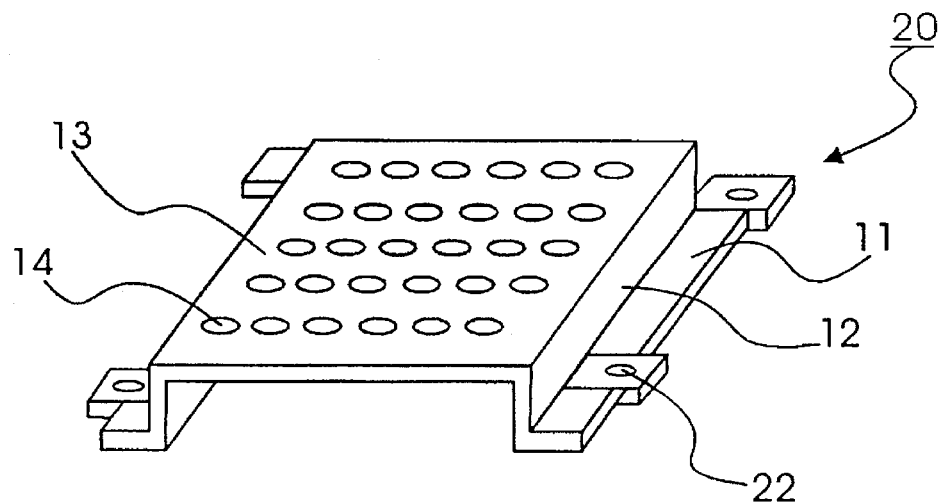
FIG. 9 illustrates an external perspective view of a protection cover constructed according to the principles of the present invention.
Figure 10:
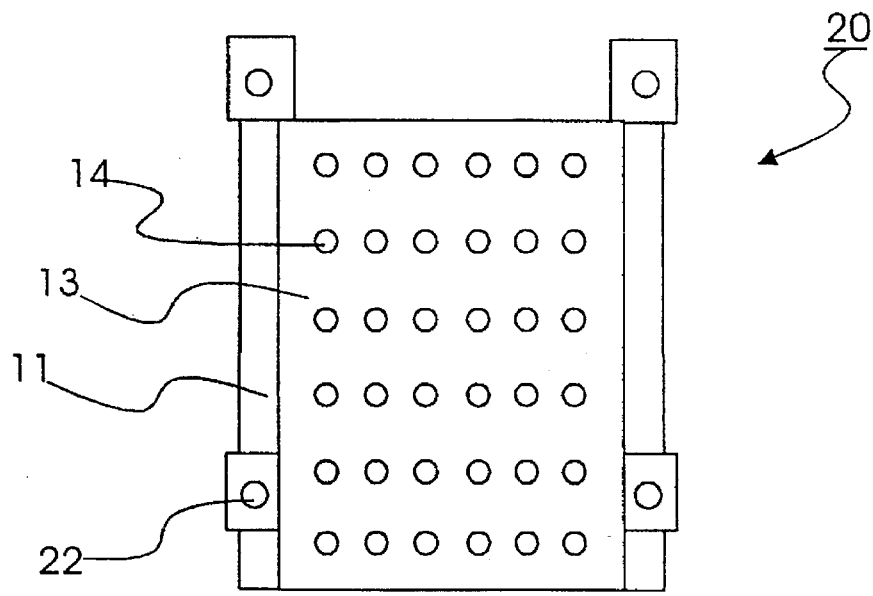
FIG. 10 illustrates a bottom plan view of a protection cover constructed according to the principles of the present invention.

A protection cover 20 constructed as a preferred embodiment of the invention is illustrated in isolation by a perspective view in FIG. 9 and by a bottom plane view in FIG. 10.

Each lip 11 may extend beyond the length of parallel side walls 12, and should include holes 22 for receiving a screw or bolt 21. Cross-member 13 is preferably a flat plate formed integrally with side walls 12 and lips 11 from thin metal or plastic to reduce the weight of protection cover 20. The weight can be further reduced by perforating the connecting member 13 with a plurality of holes 14. When the protection cover 20 is made of metal, it may be grounded to the main printed circuit board ground, to increase protection from electromagnetic interference EMI or electromagnetic conduction EMC. Whether grounded or constructed from an insulative material such as plastic, the protection cover further helps to prevent short circuits by preventing electrical components installed in the computer case 5 in a position around the port 4 from coming into contact with a conductive surface of an inserted personal computer memory card international association card.

In one preferred embodiment of the present invention, a personal computer memory card international association connector is provided having a protection cover for preventing thinner personal computer memory card international association cards of type 1 or type 2 from being incorrectly inserted into the opening for a connector supporting every type of personal computer memory card international association card. While certain present preferred embodiments of the invention have been shown and described, it is to be distinctly understood that the invention is not limited thereto but may be otherwise variously embodied and practiced within the scope of the following claims.

What is claimed is:

1. A personal computer memory card international association card connector assembly, comprising:

a connector plate having a plurality of pins arrayed at one end for electrical connection by mating with sockets in an electrical connection base of a personal computer memory card international association card having a substrate exhibiting a first height and first width, and by mating with sockets in any electrical connection bases of personal computer memory card international association cards having a substrate exhibiting said first height and said first width with an upper housing mounted on said substrate exhibiting one of a plurality of greater heights all substantially larger than said first height and a second width less than said first width, said connector plate having a pair of longitudinal side rails extending perpendicularly to said pin array to form an opening for receiving an upper housing of the personal computer memory card international association card having a greatest one of said greater heights, each said side rail including a longitudinal groove formed within a plane including said pin array, each said longitudinal groove forming a pair of opposing side walls spaced apart by said first width for accommodating reciprocal movement of opposite lateral edges of any substrate of said personal computer memory card international association card while maintaining alignment of the sockets during mating of the sockets with said plurality of pins; and a cover attached to a periphery of said connecter plate, said cover having a pair of parallel side walls each extending from a corresponding said longitudinal groove by not less than said greatest one of said greater heights, said side walls being spaced apart by said second width to refuse entry between said side walls of any substrate of said personal computer memory card international association card.

2. A personal computer memory card international association card connector as recited in claim 1 comprising means for removably attaching said cover to opposite longitudinal sides defining said periphery of said connector.

3. The personal computer memory card international association card connector assembly of claim 1, said cover further comprising:

a cross member structurally connecting ends of said parallel side walls most distant from said longitudinal grooves.

4. A personal computer memory card international association card connector as recited in claim 3, comprising means for removably attaching said cover to opposite longitudinal sides defining said periphery of said connector.

5. A personal computer memory card international association card connector assembly, comprising:

a connector plate having a central void open to receive insertion of a personal computer memory card international association card, said connector plate having an electrical connector arrayed at one end of said plate for electrical connection by mating with a conforming socket on an electrical connection base of the personal computer memory card international association card having a substrate exhibiting a first height and first width, and by mating with conforming socket in any electrical connection bases of personal computer memory card international association cards having a substrate exhibiting said first height and said first width with an upper housing borne said substrate exhibiting one of a plurality of greater heights larger than said first height and a second width less than said first width, said connector plate having a pair of longitudinal side rails extending perpendicularly to said pin array to form an opening for receiving an upper housing of the personal computer memory card international association card having a greatest one of said greater heights, each said side rail including a longitudinal groove formed within a plane including said electrical connector, said longitudinal groove being symmetrically aligned with said electrical connector, each said longitudinal groove forming one of a pair of opposing side walls spaced apart by said first width for accommodating reciprocal movement of opposite lateral edges of any substrate of said personal computer memory card international association card while maintaining alignment between the socket and said electrical connector during mating of the sockets with said electrical connector; and a cover mountable upon a periphery of said connecter plate, said cover having a pair of parallel side walls each extending from a corresponding said longitudinal groove by not less than said greatest one of said greater heights, said side walls being spaced apart by a dimension substantially less than said first width and greater than said second width to refuse entry between said side walls of any substrate of said personal computer memory card international association card not having each of opposite sides of the substrate positioned between said side rails and within a corresponding one of said longitudinal grooves.

6. The personal computer memory card international association card connector assembly of claim 5, said cover further comprising:

a web structurally connecting ends of said parallel side walls most distant from said longitudinal grooves, with said web being spaced apart from said longitudinal grooves by a distance not less than said greatest of said greater heights.

7. A personal computer memory card international association card connector as recited in claim 5, comprising means for removably attaching said cover to opposite longitudinal sides defining said periphery of said connector.

8. The personal computer memory card international association card connector assembly of claim 5, said cover further comprising:

a web structurally connecting ends of said parallel side walls most distant from said longitudinal grooves.

9. A personal computer memory card international association card connector as recited in claim 8, comprising means for removably attaching said cover to opposite longitudinal sides defining said periphery of said connector.

10. The personal computer memory card international association card connector assembly of claim 5, said cover further comprising:

a web structurally connecting ends of said parallel side walls most distant from said longitudinal grooves, with said web being spaced apart from said longitudinal grooves by a distance accommodating said insertion into said connector plate of a personal computer memory card international association card bearing an upper housing exhibiting said greatest one of said greater heights.

11. A personal computer memory card international association card connector as recited in claim 10, comprising means for removably attaching said cover to opposite longitudinal sides defining said periphery of said connector.

12. A personal computer memory card international association (PCMCIA) card connector, comprising:

a PCMCIA card of type 1 to type 3 having a plurality of pins extending therefrom, said PCMCIA card having an electrically connecting base having a first width;

a connector for receiving said plurality of pins and having space for receiving a PCMCIA card;

a U-shaped cover having a pair of lips, a pair of parallel side walls separated by a second width, said second width being less than said first width, said pair of parallel side walls having a cross member disposed therebetween, said pair of lips being perforated by screw holes, said U-shaped cover preventing said electrically connecting base of said PCMCIA from being incorrectly inserted above the connector;

a pair of guide rails, each containing an indentation, said indentation of each guide rail facing each other and separated by said first width; and a plurality of screws for fastening said U-shaped cover to said pair of guide rails.

13. The PCMCIA card of claim 12, said U-shaped cover being perforated by openings to reduce the weight of said cover.

\* \* \* \* \*